United States Patent
Yuh

[19]

[11] Patent Number: 6,154,408
[45] Date of Patent: Nov. 28, 2000

[54] SELF-REFRESH OSCILLATOR

[75] Inventor: Jong Hak Yuh, Seongnam, Rep. of Korea

[73] Assignee: Hyundai Electronis Industries Co., Ltd., Kyoungki-do, Rep. of Korea

[21] Appl. No.: 09/420,593

[22] Filed: Oct. 19, 1999

[30]     Foreign Application Priority Data

Oct. 20, 1998 [KR] Rep. of Korea ................. 98-43808

[51] Int. Cl.$^7$ .................................................. G11C 7/00
[52] U.S. Cl. ............................................ 365/222; 365/211
[58] Field of Search ............................ 365/222, 189.05, 365/194, 189.07, 211

[56]          References Cited

U.S. PATENT DOCUMENTS

| | | | |
|---|---|---|---|
| 4,982,369 | 1/1991 | Tatematsu | 365/222 |
| 5,299,168 | 3/1994 | Kang | 365/222 |
| 5,801,982 | 9/1998 | Blodgett | 365/149 |
| 5,903,506 | 5/1999 | Blodgett | 365/222 |

*Primary Examiner*—Son T. Dinh
*Assistant Examiner*—Hien Nguyen
*Attorney, Agent, or Firm*—Nath & Associates; Gary M. Nath; Harold L. Novick

[57]           ABSTRACT

A self-refresh oscillator for a semiconductor memory device includes a control signal generater sensing a variation of a potential of an inputted signal and generating a write operation control signal having a predetermined pulse width in accordance with an enable signal enabled when a self-refresh mode starts, a cell emulator feeding back the write operation control signal, performing a data write operation, and discharging an output terminal potential in accordance with a temperature variation, and a comparator selectively enabled according to the enable signal, comparing a first input signal which is an output signal from the cell emulator with a second input signal which is a reference potential, and inputting the output signal to a first input terminal of the control signal generater. As a result, the self-refresh oscillator senses the data loss of the memory cell resulting from the leakage current, and controls a refresh period, thereby minimizing the power consumption in the standby mode.

16 Claims, 9 Drawing Sheets

SELF-REFRESH OSCILLATOR

BACKGROUND OF THE INVENTION

1. Field of the Invention

The present invention relates to a self-refresh oscillator for a semiconductor memory device, and in particular to a self-refresh oscillator which can minimize power consumption in a standby mode by sensing a data loss of a memory cell resulting from leakage current, and by controlling a refresh period.

Thus, the self-refresh oscillator in accordance with the present invention can be applied to all semiconductor memory devices which carry out a self-refresh operation.

2. Description of the Background Art

In general, "self-refresh" implies that a dynamic random access memory DRAM itself has a predetermined period and performs a refresh operation in order to maintain a data stored in a memory cell in a standby mode.

As a chip density is increased due to development of DRAM fabrication techniques, high integration DRAMs such as 256 Mb DRAM and 1 Gb DRAM have been developed. Accordingly, a bit number of the DRAM is increased, and thus power consumption during the refresh operation sharply grows. It is because a capacity of a cell capacitor composing the cell is not varied or is reduced, although the number of the cells is increased. Therefore, in case an integration degree of the DRAM is increased by four times, the power consumption during the refresh operation is also increased approximately by four times.

The increase of the refresh power consumption resulting from the increase of the integration degree of the DRAM is one of the main problems in the semiconductor technological development field. Especially in a system provided with a battery such as a notebook personal computer, the power consumption in the standby mode considerably influences on a battery using time.

In the conventional art, an oscillator having a predetermined period is used in the self-refresh mode, and the refresh operation is performed in accordance with the predetermined period. Here, the predetermined period is determined according to a data maintenance time in the DRAM cell at a temperature higher than a normal temperature by predetermined degrees because the data maintenance time in the DRAM cell is very sensitive to the temperature, lasts merely for approximately 0.1 second at a high temperature, although lasting for a few seconds at the normal or low temperature.

Accordingly, the self-refresh period is determined by the very short data maintenance time at a high temperature, and thus becomes shorter. It implies that the refresh operation is often performed. As a result, the power consumption may be increased.

However, the notebook PC which is considerably influenced by the self-refresh power consumption is generally used at the normal temperature. Thus, the conventional self-refresh oscillator determining the refresh period in accordance with the high temperature data maintenance time has a disadvantage in that the power consumption in the standby mode is unnecessarily increased.

SUMMARY OF THE INVENTION

Accordingly, it is an object of the present invention to provide a self-refresh oscillator which can minimize power consumption in a standby mode by controlling a self-refresh period to be varied according to a temperature, and by prevent a refresh operation from being unnecessarily often performed.

In order to achieve the above-described object of the present invention, there is provided a self-refresh oscillator including: a control signal generating means sensing a variation of a potential of an inputted signal, and generating a write operation control signal having a predetermined pulse width in accordance with an enable signal enabled when a semiconductor memory device enters into a self-refresh mode; a cell emulation means feeding back the write operation control signal, performing a data write operation, and discharging an output terminal potential in accordance with a temperature variation; and a comparison means selectively enabled according to the enable signal, comparing a first input signal which is an output signal from the cell emulation means with a second input signal which is a reference potential, and inputting the output signal to a first input terminal of the control signal generating means.

In addition, the self-refresh oscillator in accordance with the present invention may further include a waveform control means connected to an output terminal of the control signal generating means, selectively enabled according to the enable signal, controlling a waveform of an output signal by controlling a pulse width of the input signal, and varying a refresh period.

BRIEF DESCRIPTION OF THE DRAWINGS

The present invention will become better understood with reference to the accompanying drawings which are given only by way of illustration and thus are not limitative of the present invention, wherein.

DETAILED DESCRIPTION OF THE PREFERRED EMBODIMENTS

A self-refresh oscillator in accordance with a preferred embodiment of the present invention will now be described in detail with reference to the accompanying drawings.

Figure 1:
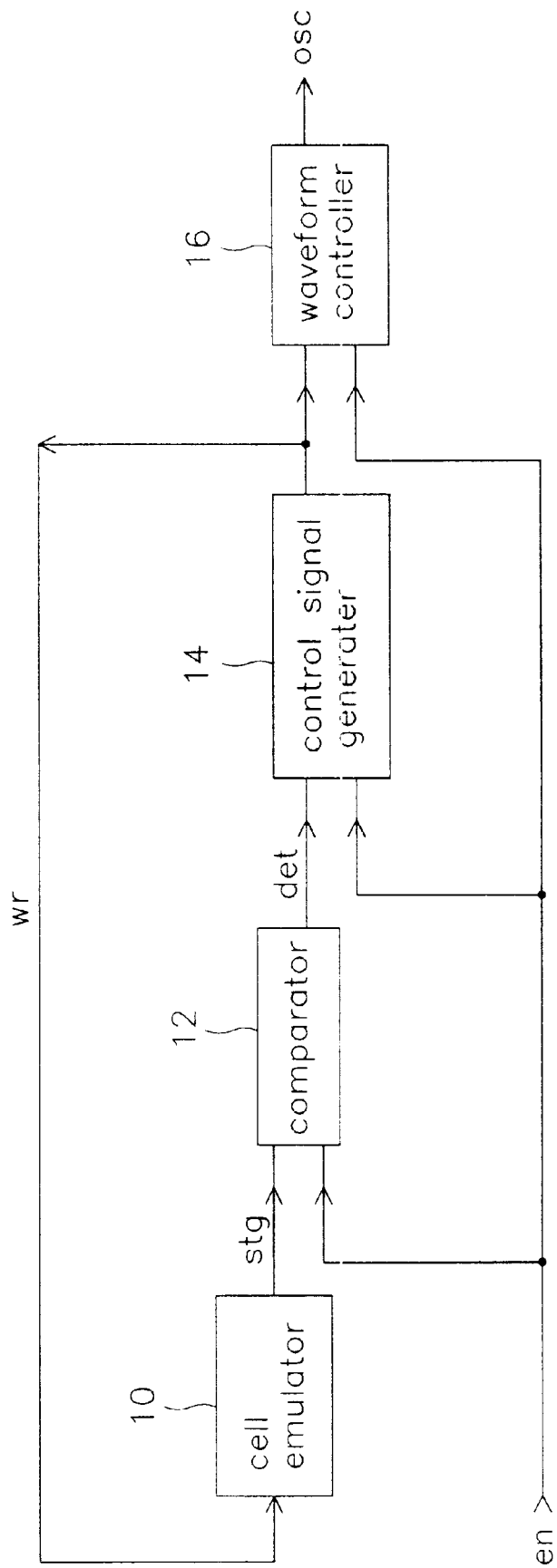
FIG. 1 is a block diagram illustrating the whole constitution of a self-refresh oscillator in accordance with the present invention.

FIG. 1 is a block diagram illustrating the whole constitution of the self-refresh oscillator in accordance with the present invention. As shown therein, the self-refresh oscillator includes: a control signal generater 14 sensing a variation of a signal (det) inputted from a preceding comparator 12, and generating a write operation control signal (wr) having a predetermined pulse width in accordance with an operation control signal (en) enabling an operation when a self-refresh mode starts; a cell emulator 10 feeding back the write operation control signal (wr), performing a data write operation, and discharging an output terminal (stg) potential in accordance with a temperature variation; a comparator 12 selectively enabled according to the operation control signal (en) of the control signal generator 14, comparing a first input signal which is an output signal (stg) from the cell emulator 10 with a second input signal which is a reference potential Vref externally applied at a predetermined potential level, and inputting the output signal (det) to a first input terminal of the control signal generator 14; and a waveform controller 16 connected to an output terminal of the control signal generater 14, selectively enabled according to the operation control signal (en), controlling a waveform of an output signal (osc) by controlling a pulse width of the output signal (det), and varying a refresh period.

FIGS. 2, 3, 4 and 9 are detailed circuit diagram respectively illustrating the cell emulator 10, the comparator 12, the control signal generater 14 and the waveform controller 16. The operation of the self-refresh oscillator in accordance with the present invention will now be described with reference to the accompanying drawings.

Figure 2:
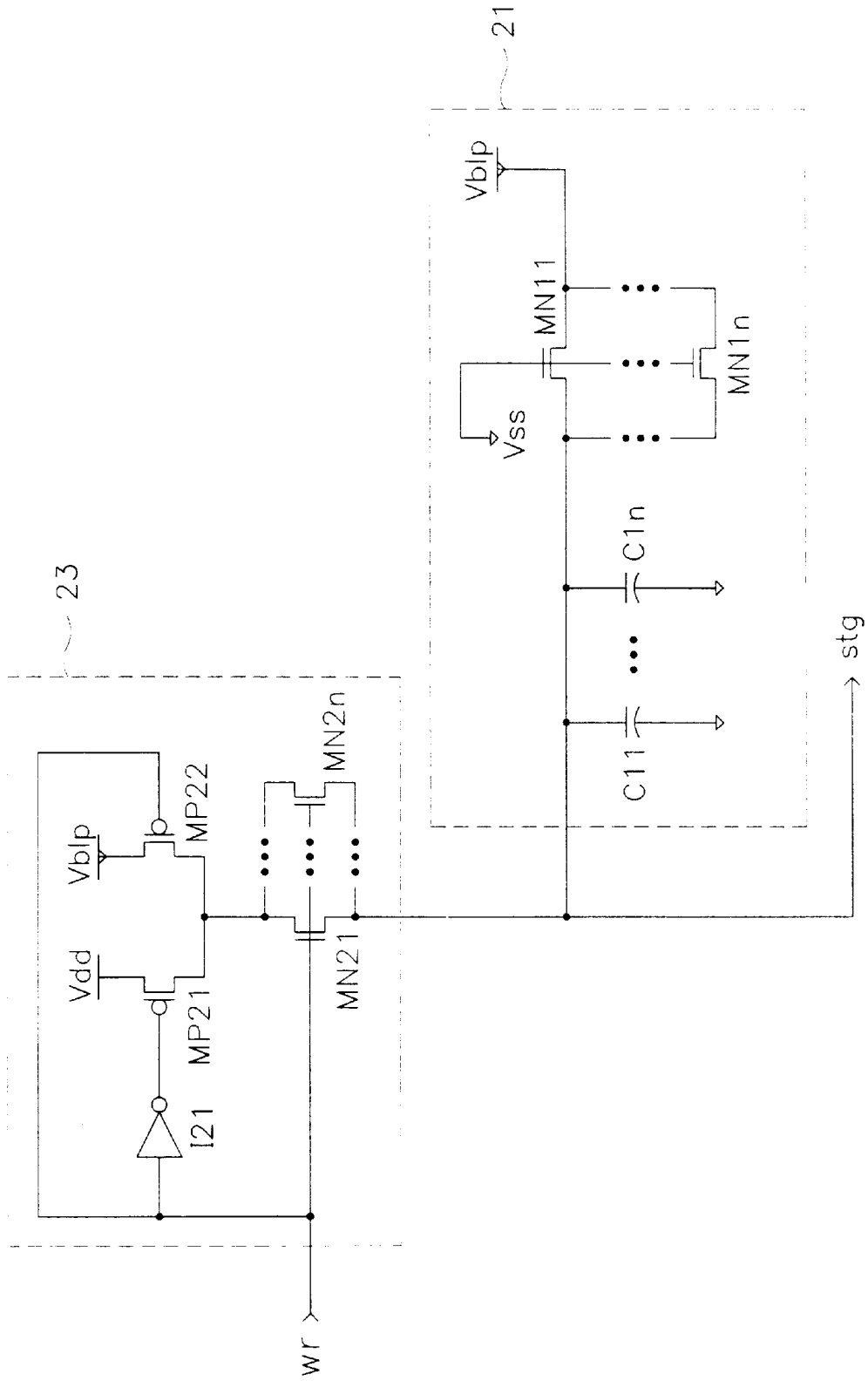
FIG. 2 is a detailed circuit diagram illustrating a cell emulator as shown in FIG. 1.

As shown in FIG. 2, the cell emulator 10 includes a cell emulation unit 21 sensing a cell data loss resulting from leakage current; and a data writing unit 23 performing a data write operation by charging the output terminal (stg) potential under the control of the output signal (wr) from the control signal generater 14, in regard to the data loss sensing of the cell emulation unit 21.

The cell emulation unit 21 includes a plurality of N channel MOS transistors MN11~MN1n having their sources connected to a bit line precharge voltage Vblp application terminal maintaining a predetermined voltage level between the power voltage Vdd and the ground voltage Vcc, and having their gates commonly grounded, the plurality of N channel MOS transistors MN11~MN1n being connected in parallel; and a plurality of cell capacitors C11~C1n connected in parallel between a node N1 commonly connected to drains of the plurality of N channel MOS transistors MN11~MN1n and the ground.

In addition, the data writing unit 23 includes: power supply devices MP21, MP22 selectively supplying the power voltage Vdd and the bit line precharge voltage Vblp in accordance with a potential level of the write operation control signal (wr) generated from the control signal generater 14; and a plurality of N channel MOS transistors MN21~MN2n connected in parallel between the common drain of the power supply devices MP21, MP22 and the output node N1 of the cell emulation unit 21, and having their gates connected to receive the write operation control signal (wr), respectively. Here, a P channel MOS transistor is used as the power supply devices. The cell emulation unit 21 as shown in FIG. 2 is a circuit constitution when the DRAM cell is at a standby mode state.

In addition, the cell emulator 10 uses the signal (stg) outputted through the output node N1 of the cell emulation unit 21 as a first input signal of the succeeding comparator 12. Accordingly, the plurality of cell capacitors C1~Cn and the plurality of cell transistors MN11~MN1n are connected in parallel by considering that the capacity of the cell capacitor used in the DRAM cell is very small, approximately 25 fF, thereby preventing mis-operation from occurring.

In addition, the data writing unit 23 responses to a high pulse of the write operation control signal (wr), supplies the power voltage Vdd to the output node N1, and performs an operation identical to an operation of writing data to the DRAM cell. In more detail, when the write operation control signal (wr) is low, the P channel MOS transistor MP22 connected to the bit line precharge voltage Vblp application terminal is turned on, thereby supplying the bit line precharge voltage Vblp to the common drain of the plurality of N channel MOS transistors MN21~MN2n which are connected in parallel. Conversely, in case the write operation control signal (wr) is high, the P channel MOS transistor MP21 connected to the power voltage Vdd application terminal is turned on, thereby supplying the power voltage Vdd to the common drain of the plurality of N channel MOS transistors MN21~MN2n which are connected in parallel.

However, the plurality of N channel MOS transistors MN21~MN2n are turned on only when the write operation control signal (wr) is high (potential over 'Vdd+Vt'). Accordingly, the power voltage is transmitted to the output node N1, and thus the output signal (stg) is charged with the power voltage Vdd.

Although the common gate of the plurality of N channel MOS transistors MN11~MN1n composing the cell emulation unit 21 is grounded, a sub-threshold current exists through the MOS transistors, and a leakage current is slightly generated due to junction, etc. The leakage current is remarkably influenced by a peripheral temperature or a process.

The output signal (stg) of the cell emulator 10 charged or discharged by the above-described operation is transmitted to the comparator 12 as the first input signal.

Figure 3:
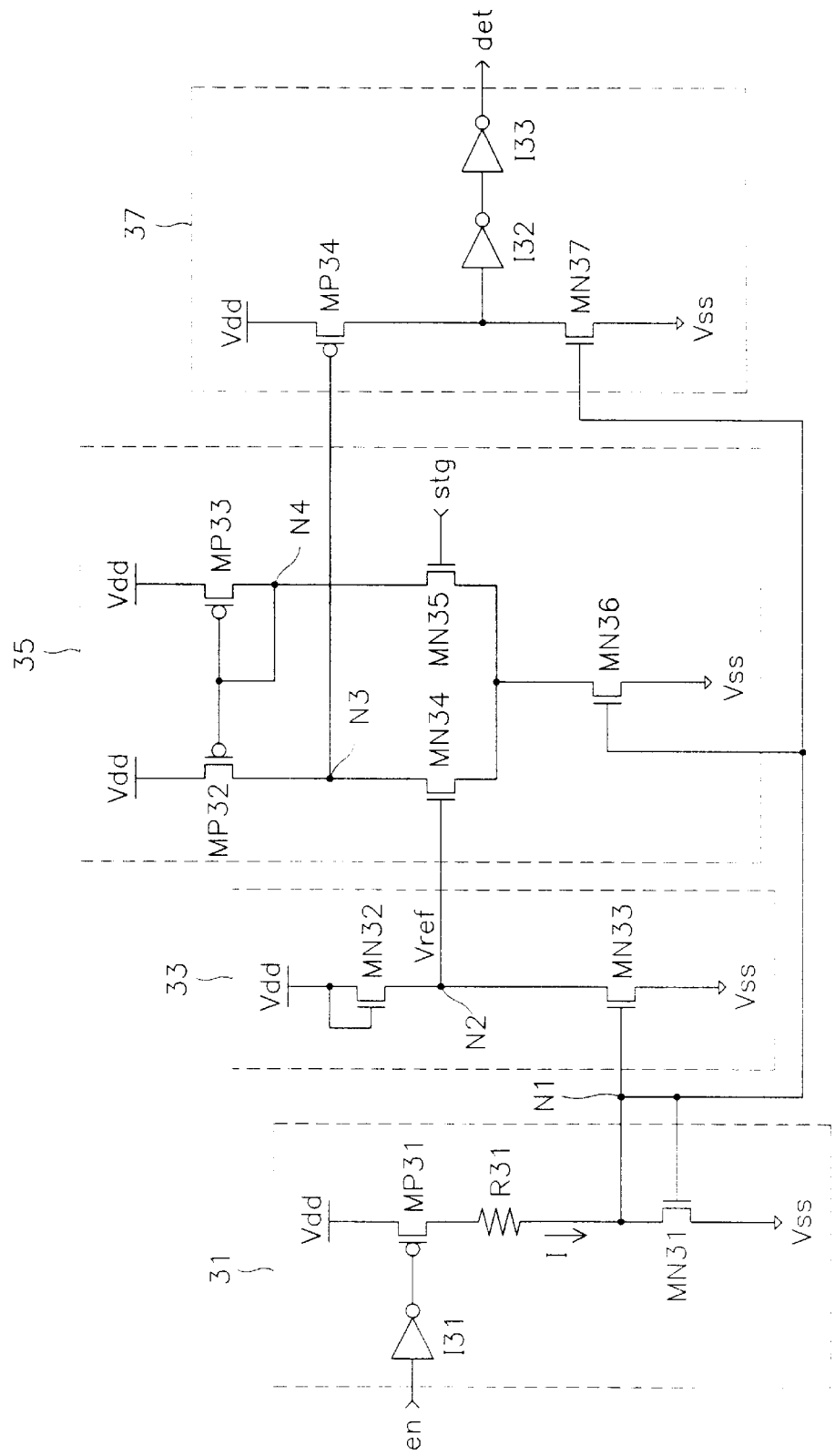
FIG. 3 is a detailed circuit diagram illustrating a comparator as shown in FIG. 1.

FIG. 3 is a detailed circuit diagram illustrating the comparator 12. The comparator 12 includes: an enable unit 31 deciding whether to enable an operation in accordance with a state of the operation control signal (en) of the self-refresh oscillator; a differential amplifying unit 35 controlled according to the potential of the output terminal N1 of the enable unit 31, and comparing and amplifying the output signal (stg) from the cell emulator 10 and the reference potential Vref; a voltage divider 33 connected between the enable unit 31 and the differential amplifying unit 35, generating a predetermined potential Vdd-Vt by voltage division, and transmitting the reference potential Vref as a first input signal of the differential amplifying unit 35; and an output driving unit 37 controlled according to the potential of the output terminal N1 of the enable unit 31, and buffering and outputting an output signal from the differential amplifying unit 35.

The detailed constitution and operation of each unit 31, 33, 35, 37 as shown in FIG. 3 will now be explained.

First, the enable unit 31 includes: an inverter I31 inverting the whole operation control signal (en); a P channel MOS transistor MP31 having its gate connected to the output terminal of the inverter I31, and its source connected to the power voltage application terminal; a resistance R31 connected between the P channel MOS transistor MP31 and the node N1, and restricting an amount of current I; and an N channel MOS transistor MN31 connected between the node N1 and the ground voltage, and having its drain and gate commonly connected to the node N1.

In the enable unit 31, when the control signal (en) is high, it is inverted into low by the inverter I31, and applied to the gate of the P channel MOS transistor MP31. Thus, power is supplied to the output node N1 through the resistance R31. Accordingly, the whole operation of the comparator 12 is enabled.

However, in case the control signal (en) is applied at a low level, it is inverted into high by the inverter I31, and applied to the gate of the P channel MOS transistor MP31.

Therefore, the P channel MOS transistor MP31 is turned off, and thus power cannot be supplied. As a result, the comparator 12 is not operated.

The voltage divider 33 includes: a diode type N channel MOS transistor MN32 connected in series between the power voltage Vdd application terminal and the ground voltage; and an N channel MOS transistor MN33 having its gate connected to the output node N1 of the enable unit 31. The reference potential Vref is supplied to the first input terminal of the differential amplifying unit 33 through the connection node N1 of the two N channel MOS transistors MN32, MN33. Here, the applied reference potential Vref is 'Vdd–Vt' (threshold potential of the N channel MOS transistor).

In addition, the differential amplifying unit 35 includes: N channel MOS transistors MN34, MN35 having their gates connected to receive the reference potential Vref generated by the operation of the voltage divider 33, and the final output signal (stg) from the cell emulator 10; an N channel MOS transistor MN36 connected between a common source of the two N channel MOS transistors MN34, MN35 and the ground, having its gate connected to the output terminal N1 of the enable unit 31, and controlling an operation enabling of the differential amplifying unit 35; and P channel MOS transistors MP32, MP33 having a current mirror structure connected between the power voltage Vdd application terminals and each drain of the two N channel MOS transistors MN34, MN35. The gates of the two P channel MOS transistors MP32, MP33 are commonly connected to a connection node N4 of the P and N channel MOS transistors MP33, MN35.

The differential amplifying unit 35 having the current mirror structure outputs a resultant value after comparing and amplifying two input signals (Vref), (stg) through an output node N which is a connection node of the P and N channel MOS transistors MP32, MN34.

The output driving unit 37 includes: P and N channel MOS transistors MP34, MN37 connected in series between the power voltage application terminal Vdd and the ground Vss; and two inverters I32, I33 connected in series, and buffering and outputting a potential of the output node N5 to the final output terminal (det) of the comparator 12. The output driving unit 37 varies the final output signal (det) in accordance with the output signal of the differential amplifying unit 35.

Figure 4:
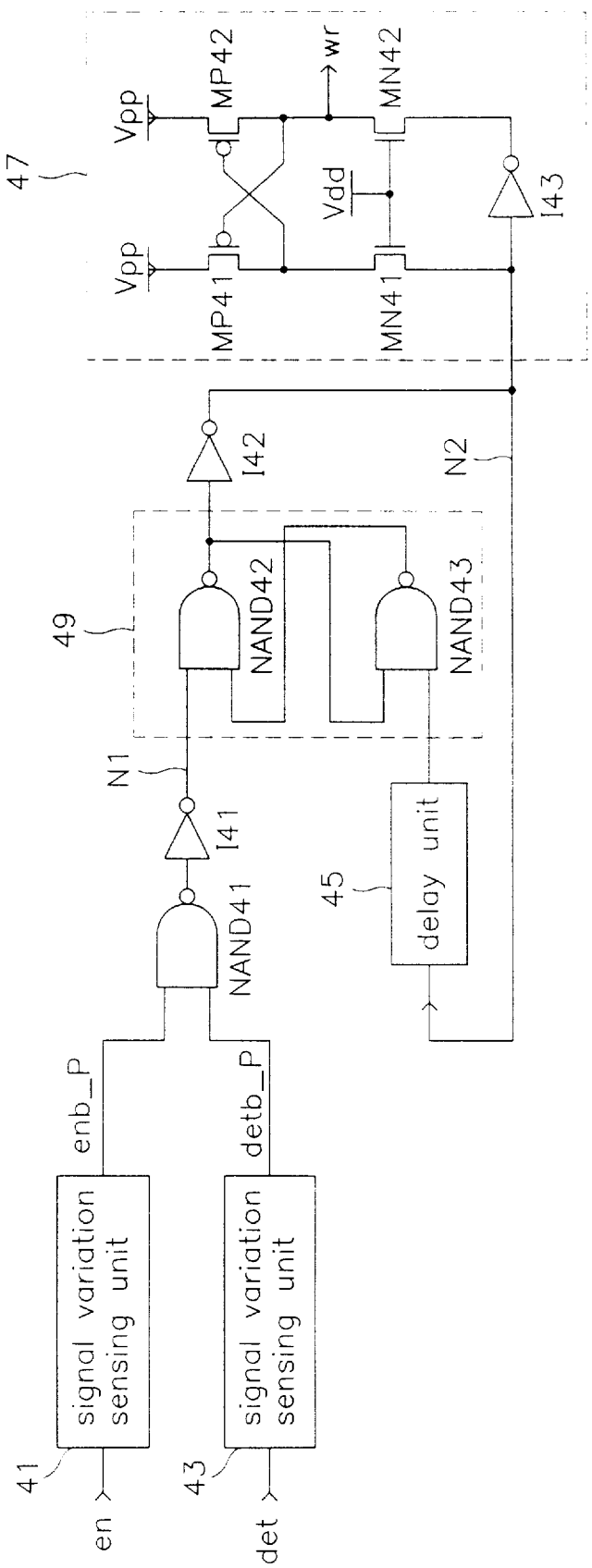
FIG. 4 is a detailed circuit diagram illustrating a control signal generater as shown in FIG. 1.

FIG. 4 is a detailed circuit diagram illustrating the control signal generator 14 receiving the output signal (det) from the comparator 12 and the whole operation control signal (en), sensing a variation of a potential of the two signals (det), (en), and generating the write operation control signal (wr) having a predetermined pulse width (several tens nanoseconds). The detailed constitution thereof will now be described.

The control signal generator 14 includes: first and second signal variation sensing units 41, 43 receiving the two input signals (en), (det), and sensing a potential level variation thereof; a NAND gate NAND41 and an inverter I41 connected in series, receiving and NANDing output signals (enb_p), (detb_p) from the first and second signal sensing units 41, 43, and varying the potential of the node N1; a latch unit 49 having an RS flip-flop structure consisting of two NAND gates NAND42, NAND43 connected to the output terminal of the inverter I41, and latching an output signal from the inverter I41; an inverter I42 inverting an output terminal potential of the latch unit 49, and transmitting it to the node N2; a delay unit 45 delaying the potential of the node N2 for a predetermined time, and feeding-back it to a first input terminal of the NAND gate NAND43 of the latch unit 49; and a level converting unit 47 connected to the node N2, and converting the signal of the node N2 varying from the ground potential Vss to the power potential Vdd into the write operation control signal (wr) of a high pulse varying from the ground potential to a potential Vpp higher than the power potential Vdd by a predetermined potential.

The level converting unit 47 includes: P channel MOS transistors MP41, MP42 having their sources connected to receive the potential Vpp higher than the power voltage by a predetermined potential, and having their gates connected to drains in a cross-couple structure; an N channel MOS transistor MN41 connected between the P channel MOS transistor MP41 and the node N2, and having its gate connected to receive the power voltage Vdd; and an N channel MOS transistor MN42 connected between the P channel MOS transistor MP42 and an output terminal of the inverter I43 inverting the potential of the node N2, and having its gate commonly connected to the power voltage Vdd application terminal with the N channel MOS transistor MN42. The level converting unit 47 outputs the write operation control signal (wr) which is the final output signal to the connection node of the P and N channel MOS transistors MP42, MN42.

Figure 6:
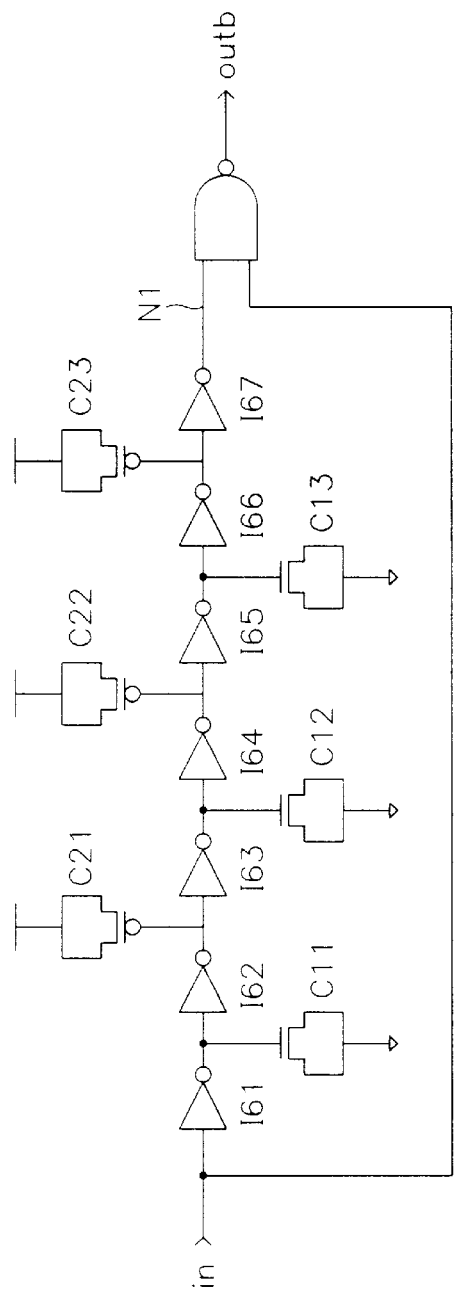
FIG. 6 is a detailed circuit diagram illustrating an embodiment of a signal variation sensing unit as shown in FIG. 4.
Figure 8:
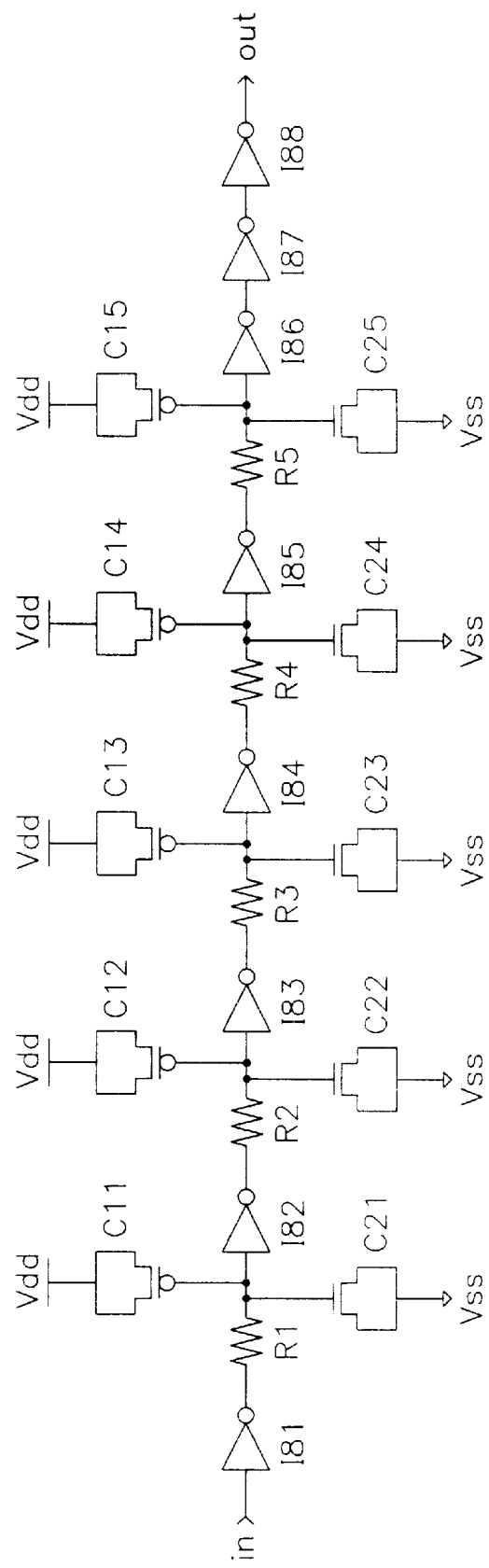
FIG. 8 is a detailed circuit diagram illustrating an embodiment of a delay unit as shown in FIG. 4.

FIGS. 6 and 8 are circuit diagrams illustrating embodiments of the signal variation sensing units 41, 43 and the delay unit 45 as depicted in FIG. 4, respectively.

As shown in FIG. 6, the signal variation sensing unit 41, 43 includes: an odd number of inverters (there are seven inverters I61~I67 in FIG. 6) connected in series, and receiving, inverting and delaying a signal (in); P channel MOS transistor type capacitors C21, C22, C23 having their gates connected to output terminals of 2n-th inverters among the serially-connected inverters I61~I67, and their drains and sources commonly connected to the power voltage Vdd application terminal; N channel MOS transistor type capacitors C11, C12, C13 having their gates connected to output terminals of 2n-1th inverters among the serially-connected inverters I61~I67, and their drains and sources commonly connected to the ground voltage Vss application terminal; and a NAND gate NAND61 NANDing and outputting (outb) a first input signal which is the input signal (in) and a second input signal which is the output terminal N1 signal of the serially-connected inverters I61~I67.

Figure 7:
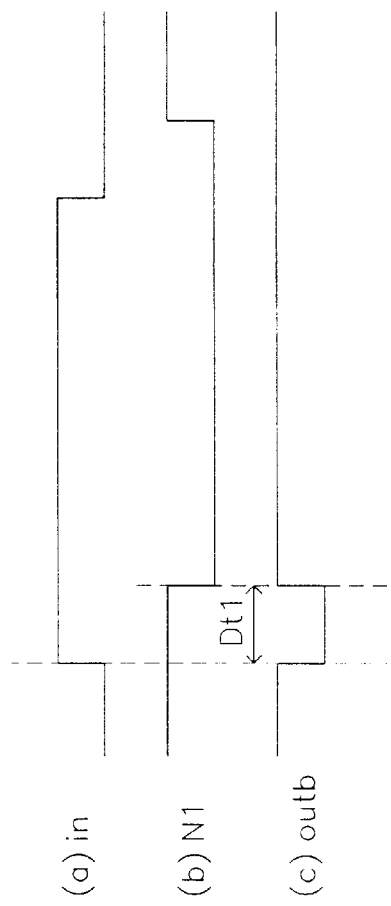
FIG. 7 is an operational timing diagram of FIG. 6.

FIG. 7 is an operational timing diagram showing the operation of the signal variation sensing unit 41, 43 as shown in FIG. 6. When a potential of the input signal (in) is transited from low to high as shown in FIG. 7(a), a potential of the node N1 is transited from high to low after a predetermined delay Dt1 as shown in FIG. 7(b). The output signal (outb) outputs a low signal having a pulse width as much as the delay width Dt1 by the NAND gate NAND using the potential of the node N1 as the first input signal, as shown in FIG. 7(c).

FIG. 8 shows an embodiment of the delay unit 45 as shown in FIG. 4. The delay unit 45 includes: a plurality of inverters I81~I88 which are delay units connected in series; a plurality of resistances R1~R5 which are delay units connected between the inverters I81~I88; a plurality of P channel MOS transistor type capacitors C11~C15 connected between the power voltage Vdd application terminal and each node between the resistances and the inverters; and a plurality of N channel MOS transistor type capacitors C21~C25 connected between each node between the resistances and inverters and the ground Vss, thereby performing a simple time delay operation.

A potential of 'Vdd+2Vt' is employed as the high potential Vpp in the level converting unit 47 as shown in FIG. 4.

Figure 5:
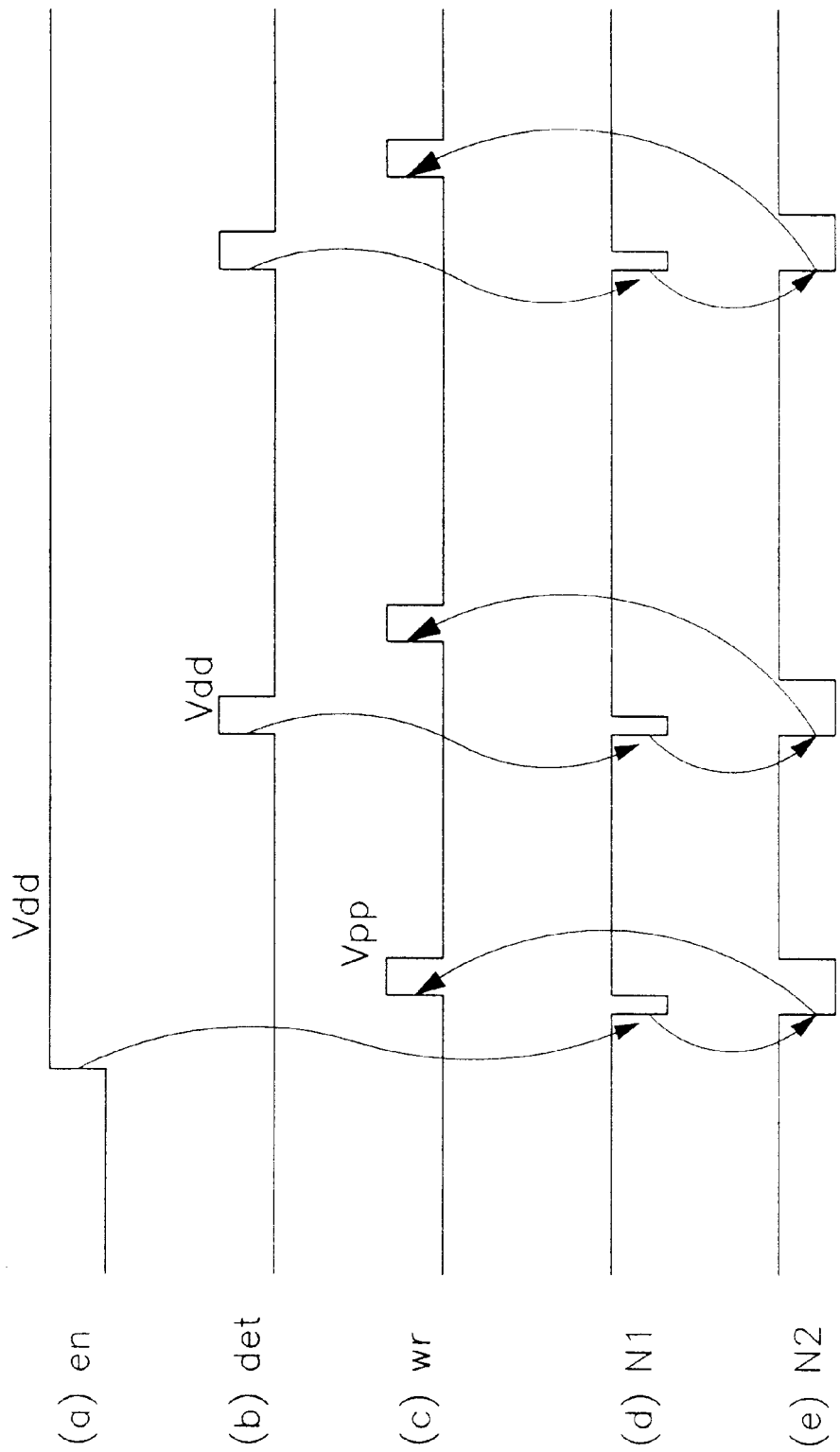
FIG. 5 is an operational timing diagram of FIG. 4.

FIG. 5 is an operational timing diagram of the control signal generator 14 as shown in FIG. 4. When the signals (en) (det) are transited from low Vss to high Vdd as shown in FIGS. 5(a) and 5(b), the output signals (enb_p), (detb_p) of the signal variation sensing units 41, 43 generate a low signal, thereby outputting a low pulse signal to the output node N1 of the inverter I41, as shown in FIG. 5(d). Then, a low pulse signal having a predetermined pulse width as shown in FIG. 5(e) is outputted from the node N2 via the delay unit 45 and the latch unit 49 as shown in FIG. 4. Thereafter, as shown in FIG. 5(c), the final output signal (wr) outputs the high potential Vpp signal having an identical pulse width to the node N2 signal as shown in FIG. 5(e) by the level converting unit 47.

Figure 9:
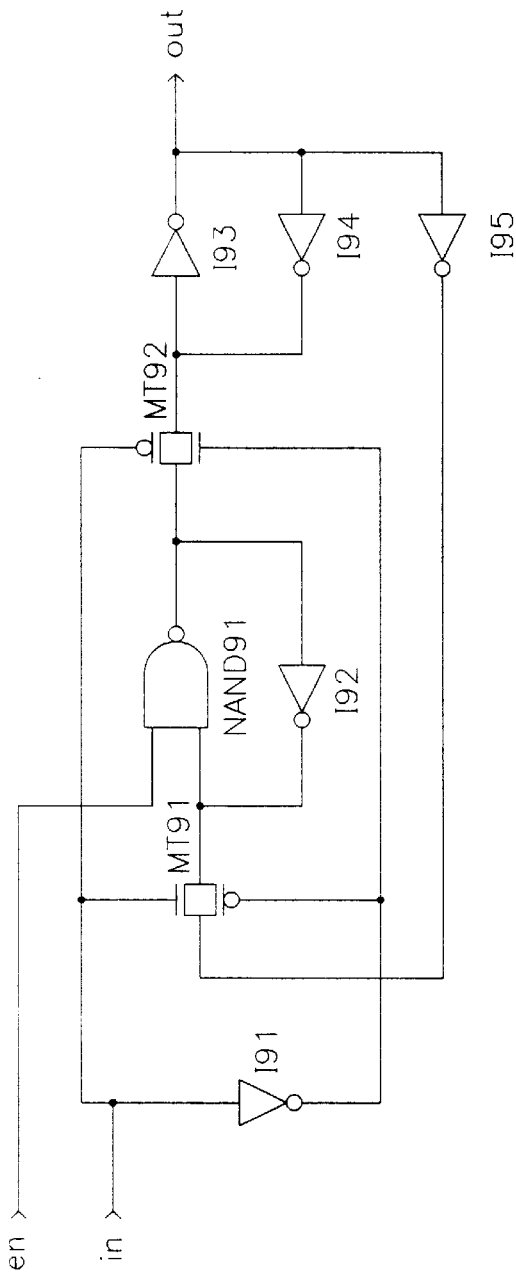
FIG. 9 is a detailed circuit diagram illustrating a waveform controller as shown in FIG. 1.
Figure 10:
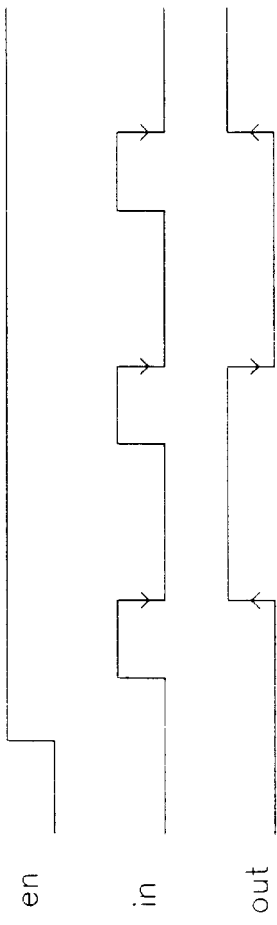
FIG. 10 is an operational timing diagram of FIG. 9.

FIG. 9 is a detailed circuit diagram illustrating the waveform controller 16 as shown in FIG. 1, and FIG. 10 shows an operation thereof by waveforms of each unit signal. As shown in FIG. 9, the waveform controller 16 includes: first and second transmission gates MT91, MT92 selectively turned on according to the state of the input data (in); a NAND gate NAND NANDing the operation enable signal (en) and an output signal from the first transmission gate MT91, and outputting it to an input terminal of the second transmission gate MT2; an inverter I92 feeding back an output signal from the NAND gate NAND91 to the output node of the first transmission gate MT91; two inverters I93, I94 having their input and output terminals connected to each other in order to latch and output an output terminal potential of the second transmission gate MT92 to an output terminal (out); and an inverter I95 inverting the output terminal (out) potential, and feeding back it to an input terminal of the first transmission gate MT91.

The thusly-constituted waveform controller 16 is a circuit for removing a difference of a duty rate of a high pulse width and a low pulse width of the output signal (det) from the comparator 12. As depicted in the operational timing diagram of FIG. 10, a potential of the output signal is varied at a falling edge of the input signal (in), thereby generating the output signal (out) having a double period of the input signal (in). Accordingly, a frequency of the final output signal (osc) becomes a half of a frequency of the output signal (det) from the comparator 12.

Figure 11:
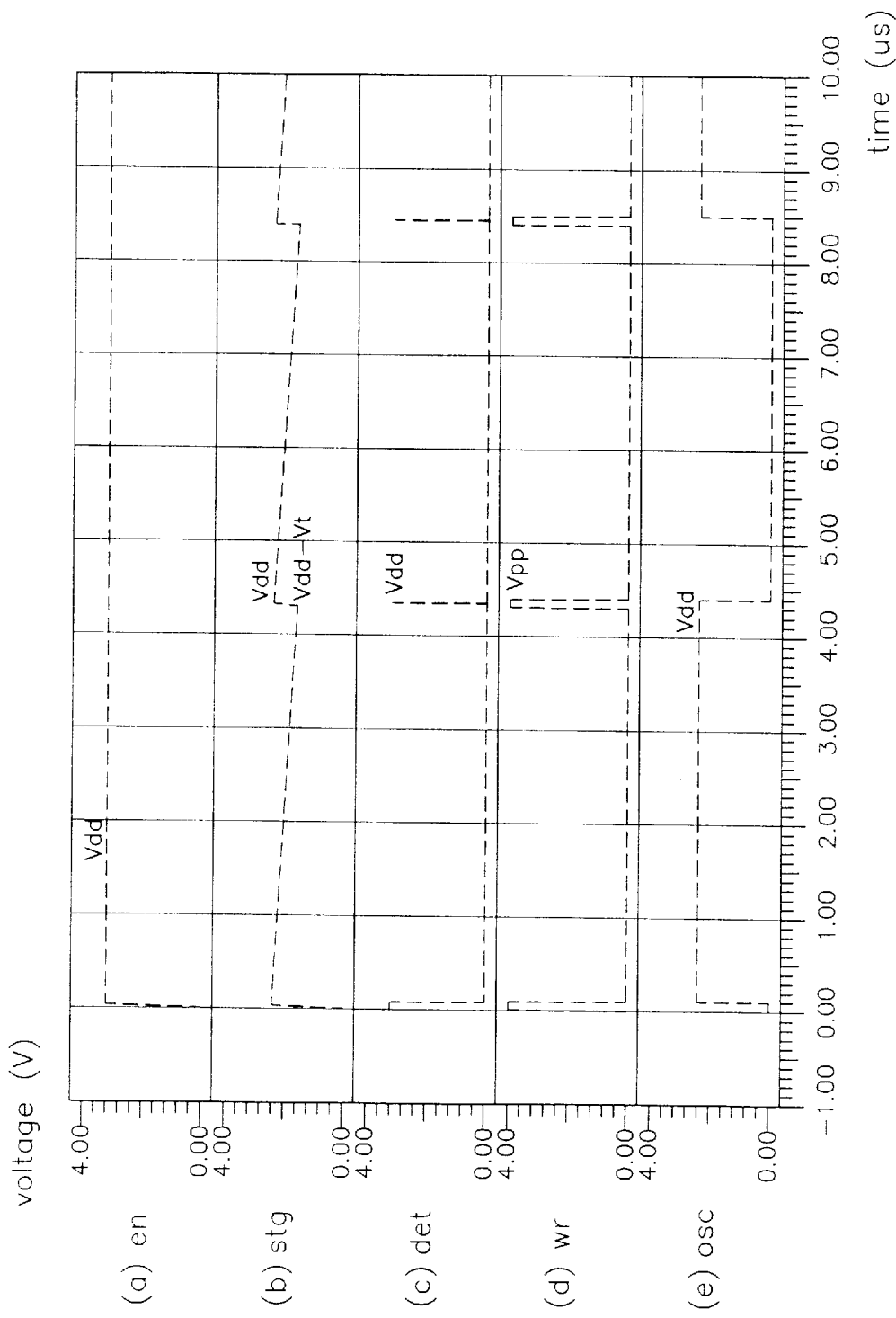
FIG. 11 shows a simulation result of the self-refresh oscillator in accordance with the present invention.

FIG. 11 depicts a simulation result of the self-refresh oscillator in accordance with the present invention. When the output signal (stg) of the cell emulator 10 sensing a cell data loss resulting from leakage current generated due to various reasons, such as voltage level and process is discharged to a predetermined potential level Vdd−Vt as shown in FIG. 11(b), it is sensed by the reference potential Vref≈Vdd−Vt of the comparator 12, thereby outputting the signal (det) as shown in FIG. 11(c).

The control signal generator 14 receiving the signal (det) outputs the high potential signal Vpp≈Vdd+2Vt having a predetermined pulse width as the final output signal (wr) as shown in FIG. 11(d).

The cell emulator 10 feed backing the high potential level write operation control signal (wr) from the control signal generator 14 is charged to the power potential Vdd level during the pulse width that the output signal (wr) is generated at the high potential Vpp in the control signal generator 14. The charged output signal (stg) of the cell emulator 10 is inputted to the succeeding comparator 12. The comparator 12 outputs a low signal as the output signal (det) until the output signal (stg) from the cell emulator 10 is discharged below the predetermined potential Vdd−Vt.

Thereafter, in case the output signal (stg) from the cell emulator 10 is continuously discharged due to various reasons, such as a temperature, and thus reduced to the Vdd−Vt level, the above-mentioned operation is repeated, thereby re-charging the output signal (stg).

The final output signal (osc) having a signal waveform as shown in FIG. 11(e) is varied having a double period of the output signal (det) from the comparator 12 as shown in FIG. 11(c). The signal waveform implies an operation for generating the refresh control signal (osc) having a different period by the comparator 12 varying the output signal (det) to different timing according to the temperature, applied voltage and process.

As discussed earlier, the self-refresh oscillator in accordance with the present invention senses that the cell data are lost due to leakage current, and controls the refresh period according to the cell data state, thereby remarkably reducing power consumption during the standby mode.

Accordingly, the battery using time of the system operated by the battery can be sufficiently extended.

As the present invention may be embodied in several forms without departing from the spirit or essential characteristics thereof, it should also be understood that the above-described embodiment is not limited by any of the details of the foregoing description, unless otherwise specified, but rather should be construed broadly within its spirit and scope as defined in the appended claims, and therefore all changes and modifications that fall within the meets and bounds of the claims, or equivalences of such meets and bounds are therefore intended to be embraced by the appended claims.

What is claimed is:

1. A self-refresh oscillator comprising:
    a control signal generating means for sensing a variation of a potential of an inputted signal, and for generating a write operation control signal having a predetermined pulse width in accordance with an enable signal enabled when a semiconductor memory device enters into a self-refresh mode;
    a cell emulation means for feeding back the write operation control signal, performing a data write operation, and discharging an output terminal potential in accordance with a temperature variation; and
    a comparison means selectively enabled according to the enable signal, comparing a first input signal which is an output signal from the cell emulation means with a second input signal which is a reference potential, and inputting the output signal to a first input terminal of the control signal generating means.

2. The self-refresh oscillator according to claim 1, wherein the control signal generating means comprises:
    first and second signal variation sensing units for receiving the enable signal and the output signal from the comparison means, and for sensing a potential level variation thereof;
    a logic operation unit for performing a logic operation on output signals from the first and second signal variation sensing units;
    a latch unit for latching an output signal from the logic operation unit;
    an inverter for inverting an output terminal potential of the latch unit;
    a delay unit for delaying an output signal from the inverter for a predetermined time, and feeding-back it to the latch unit; and a level converting unit connected to an output terminal of the inverter, and outputting a potential level of the output signal as a write operation control signal varied to a high potential over the power potential by a predetermined potential.

3. The self-refresh oscillator according to claim 2, wherein each of the first and second signal variation sensing units comprises:

an odd number of inverters connected in series, and inverting and delaying an inputted signal;

a plurality of P channel MOS transistor type capacitors having their gates connected to output terminals of 2n-th inverters among the inverters, and their drains and sources commonly connected to the power voltage application terminal;

a plurality of N channel MOS transistor type capacitors having their gates connected to output terminals of 2n-1th inverters among the inverters, and their drains and sources commonly connected to the ground voltage application terminal; and a NAND gate for performing a logic operation on the input signal and a final output signal from the serially-connected inverters.

4. The self-refresh oscillator according to claim 3, wherein n is a natural number.

5. The self-refresh oscillator according to claim 2, wherein the logic operation unit comprises a NAND gate and an inverter which are connected in series.

6. The self-refresh oscillator according to claim 2, wherein the latch unit comprises an RS flip-flop consisting of two NAND gates.

7. The self-refresh oscillator according to claim 2, wherein the level converting unit comprises:

two P channel MOS transistors having their sources connected to receive a potential higher than the power voltage by a predetermined potential, and having their gates connected to drains in a cross-couple structure, respectively;

two N channel MOS transistors connected to the drains of the two P channel MOS transistors, and having their gates connected to receive the power voltage, respectively; and an inverter connected between the sources of the two N channel MOS transistors.

8. The self-refresh oscillator according to claim 1, wherein the cell emulation means comprises:

a cell emulation unit for sensing a cell data loss resulting from leakage current; and a data writing unit for performing a data write operation by charging the output terminal potential under the control of the output signal from the control signal generating means, in regard to the data loss sensing of the cell emulation unit.

9. The self-refresh oscillator according to claim 8, wherein the cell emulation unit comprises:

a plurality of N channel MOS transistors having their sources connected to a bit line precharge voltage application terminal maintaining a predetermined voltage level between the power voltage and the ground voltage, and having their gates commonly grounded, the plurality of N channel MOS transistors being connected in parallel; and a plurality of cell capacitors connected in parallel between a node commonly connected to drains of the plurality of N channel MOS transistors and the ground.

10. The self-refresh oscillator according to claim 8, wherein the data writing unit comprises:

power supply devices selectively supplying the power voltage and the bit line precharge voltage in accordance with a potential level of the enable signal; and a plurality of N channel MOS transistors connected in parallel between the common drain of the power supply devices and the output node of the cell emulation unit, and having their gates connected to receive the write operation control signal, respectively.

11. The self-refresh oscillator according to claim 10, wherein each of the power supply devices comprises a P channel MOS transistor.

12. The self-refresh oscillator according to claim 1, wherein the comparison means comprises:

an enable unit for deciding whether to enable an operation in accordance with a state of the enable signal;

a differential amplifying unit controlled according to the potential of the output terminal of the enable unit, and comparing and amplifying the output signal from the cell emulation means and the reference potential;

a voltage divider connected between the enable unit and the differential amplifying unit, generating a predetermined potential by voltage division, and transmitting it to the reference potential input terminal of the differential amplifying unit; and an output driving unit controlled according to the potential of the output terminal of the enable unit, and buffering and outputting an output signal from the differential amplifying unit.

13. The self-refresh oscillator according to claim 12, wherein the predetermined potential is a potential lower than the power potential by a threshold potential of the N channel MOS transistor.

14. The self-refresh oscillator according to claim 1, wherein the waveform control means comprises:

first and second transmission gates selectively turned on according to the state of the input data;

a logic device for performing a logic operation on the enable signal and an output signal from the first transmission gate, and for outputting it to an input terminal of the second transmission gate;

an inverter for feeding back an output signal from the logic device to the output terminal of the first transmission gate;

two inverters having their input and output terminals connected to each other in order to latch and transmit an output signal from the second transmission gate to a final output terminal; and an inverter for inverting the final output terminal potential, and for feeding back it to an input terminal of the first transmission gate.

15. The self-refresh oscillator according to claim 14, wherein the logic device comprises a NAND gate.

16. The self-refresh oscillator according to claim 1, further comprising a waveform control means connected to an output terminal of the control signal generating means, selectively enabled according to the enable signal, controlling a waveform of an output signal by controlling a pulse width of the input signal, and varying a refresh period.

* * * * *